United States Patent
Do et al.

(10) Patent No.: US 11,089,244 B2
(45) Date of Patent: Aug. 10, 2021

(54) SMALL PIXEL HIGH DYNAMIC RANGE PIXEL SENSOR

(71) Applicant: BAE Systems Imaging Solutions Inc., San Jose, CA (US)

(72) Inventors: Hung T. Do, San Jose, CA (US); Chenguang Gong, San Jose, CA (US); Paul G. Lim, San Jose, CA (US); Alberto M. Magnani, Danville, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 127 days.

(21) Appl. No.: 16/708,111

(22) Filed: Dec. 9, 2019

(65) Prior Publication Data

US 2021/0176414 A1    Jun. 10, 2021

(51) Int. Cl.
*H04N 5/355*    (2011.01)
*H01L 27/146*    (2006.01)
(Continued)

(52) U.S. Cl.
CPC ..... *H04N 5/3559* (2013.01); *H01L 27/14612* (2013.01); *H01L 27/14643* (2013.01);
(Continued)

(58) Field of Classification Search
CPC .... H04N 5/3559; H04N 5/378; H04N 5/3745; H04N 5/2355; H04N 5/355;
(Continued)

(56) References Cited

U.S. PATENT DOCUMENTS

2002/0171881 A1    11/2002    Merrill et al.
2012/0326008 A1    12/2012    Mckee et al.
(Continued)

FOREIGN PATENT DOCUMENTS

WO    2018/140012 A1    2/2018

OTHER PUBLICATIONS

Lalanne, et al., A native HDR 115dB 3.2μm BSI pixel using electron and hole collection, 2017 Image Sensor Workshop, pp. 278-281.
(Continued)

*Primary Examiner* — Albert H Cutler
(74) *Attorney, Agent, or Firm* — Calvin B. Ward

(57) ABSTRACT

An imaging array and a pixel sensor are disclosed. One of the pixel sensors in the imaging array includes a photodiode having a cathode connected to an electron storage node and an anode connected to a hole storage node. An overflow path connects the electron storage node via an overflow gate that allows electrons to leak off of the electron storage node into the overflow path if the electron storage node has a potential less than a leakage potential. A floating diffusion node is connected to the electron storage node by a transfer gate and the overflow path by an overflow path gate. A hole storage node reset gate connects the hole storage node to ground. A hole storage capacitor is connected between the hole storage node and ground, and an overflow path coupling capacitor connects the hole storage node to the overflow path.

12 Claims, 6 Drawing Sheets

(51) Int. Cl.
  *H04N 5/378* (2011.01)
  *H04N 5/3745* (2011.01)
(52) U.S. Cl.
  CPC ....... *H01L 27/14656* (2013.01); *H04N 5/378* (2013.01); *H04N 5/3745* (2013.01)
(58) Field of Classification Search
  CPC .... H04N 5/35575; H04N 5/369; H04N 5/374; H04N 5/3741; H04N 5/37452; H04N 5/359; H04N 5/3591; H04N 5/3597; H01L 27/14656; H01L 27/14612; H01L 27/14643
  See application file for complete search history.

(56) References Cited

U.S. PATENT DOCUMENTS

| | | | |
|---|---|---|---|
| 2014/0124839 A1* | 5/2014 | De Wit | H04N 5/3592 257/222 |
| 2017/0094202 A1 | 3/2017 | Kobayashi et al. | |
| 2017/0186806 A1* | 6/2017 | Lalanne | H04N 5/3745 |
| 2017/0317122 A1 | 11/2017 | Wan et al. | |
| 2017/0373106 A1 | 12/2017 | Li et al. | |
| 2019/0158718 A1* | 5/2019 | Peizerat | H04N 5/355 |
| 2019/0297292 A1 | 9/2019 | Hynecek | |

OTHER PUBLICATIONS

Wang, et al., An 89dB Dynamic Range CMOS Image Sensor with Dual Transfer Gate Pixel, 2011 International Image Sensor, Paper No. R35.
International Search Report, PCT/US20/63557, dated Mar. 8, 2021, 7 pages.

* cited by examiner

SMALL PIXEL HIGH DYNAMIC RANGE PIXEL SENSOR

BACKGROUND

Digital cameras depend on imaging arrays constructed from pixel sensors that measure the light intensity at corresponding points in a scene that is being recorded. The dynamic range of a pixel sensor is defined to be the ratio of the largest intensity that a pixel sensor can measure divided by the smallest intensity that a pixel sensor can measure for a given exposure. Improvements in noise levels have now reduced the smallest signal to be a signal that is determined by shot noise. Further improvements in the smallest signal that can be detected are not expected to significantly change the dynamic range of a pixel sensor. Hence, improvements in the dynamic range are directed to increasing the size of the largest intensity that can be measured by the pixel sensor without the sensor becoming saturated or nonlinear.

One class of prior art pixel sensors extends the dynamic range of a single photodiode by capturing the charge that overflows from the photodiode on a capacitor. At the end of the exposure, the charge that remains on the photodiode and the charge that is stored on the capacitor are read out and used to provide the final amplitude for the pixel sensor in question. This class of solutions requires one capacitor for each pixel sensor. As the size of the pixel sensors decrease in response to the need for smaller cameras, the space available for the capacitor decreases, and hence, the maximum amount of overflow charge that can be stored is reduced.

SUMMARY

The present disclosure describes an imaging array and a pixel sensor for use in an imaging array. The imaging array includes a plurality of pixel sensors connected to a bit line. At least one of the pixel sensors includes a photodiode having a cathode connected to an electron storage node and an anode connected to a hole storage node. An overflow path connects the electron storage node via an overflow gate that allows electrons to leak off of the electron storage node into the overflow path if the electron storage node has a potential less than a leakage potential. A floating diffusion node is connected to the electron storage node by a transfer gate. An overflow path gate connects the overflow path to the floating diffusion node. A hole storage node reset gate connects the hole storage node to ground. The pixel sensor also includes a hole storage capacitor having a terminal connected to the hole storage node and another terminal connected to ground, and an overflow path coupling capacitor connecting the hole storage node to the overflow path.

In one aspect, the at least one of the pixel sensors includes a reset gate that connects the floating diffusion node to a reset bus, a buffer amplifier that generates a potential on an output potential indicative of a potential on the floating diffusion node, and a selection gate that couples the output potential to a bit line in response to a row selection signal.

In another aspect, the photodiode in the at least one of the pixel sensors is fabricated in a substrate and the hole storage capacitor includes a trench surrounding the photodiode in the substrate, the trench being lined with an insulator and filled with a conductor, the conductor being connected to ground, the trench isolating the photodiode from neighboring pixel sensors.

In another aspect, the imaging array includes a controller that initializes the pixel sensor by connecting the electron storage node, the overflow path, and the floating diffusion node to a reset bus at a reset potential and the hole storage node to ground, and then isolates the electron storage node and the floating diffusion node from the reset bus while leaving the overflow path connected to the floating diffusion node.

In another aspect, the controller measures an overflow charge that leaked off of the electron storage node during a prior exposure of the photodiode in the at least one of the pixel sensors.

In another aspect, the controller measures the overflow charge from a previous exposure in two steps, the first step includes measuring a voltage on the floating diffusion node after the exposure.

In another aspect, the second step includes resetting the floating diffusion node to a reset potential in the at least one of the pixel sensors, measuring the reset potential, resetting the hole node to ground, and then measuring the potential of the floating diffusion node.

In another aspect, the controller measures a photodiode charge stored on the photodiode in the at least one of the pixel sensors from a previous exposure after measuring the overflow charge.

In another aspect, the photodiode charge in the at least one of the pixel sensors is measured using correlated double sampling.

DETAILED DESCRIPTION

Figure 1:
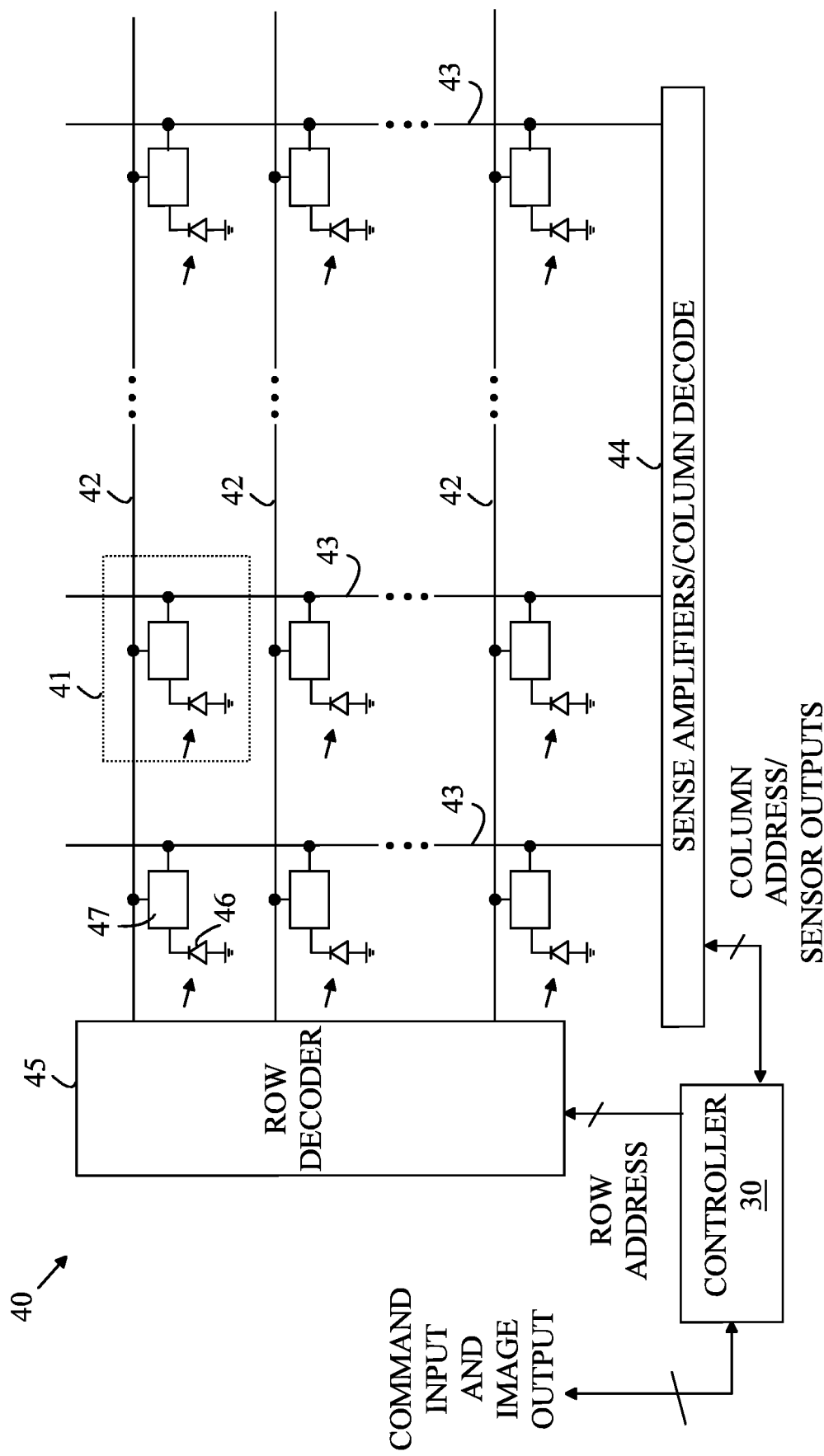
FIG. 1 is a schematic drawing of one embodiment of a CMOS imaging array.

Refer now to FIG. 1, which is a schematic drawing of one embodiment of a CMOS imaging array. Imaging array 40 is constructed from an array of pixel sensors 41 which in this example is rectangular. Each pixel sensor includes a photodiode 46 and an interface circuit 47. The details of the interface circuit depend on the particular pixel design. However, all of the pixel sensors include a gate that is connected to a row line 42 that is used to connect that pixel sensor to a bit line 43. The specific row that is enabled at any time is determined by a row address that is input to a row decoder 45. The row select lines are a parallel array of conductors that run horizontally in the metal layers over the substrate in which the photodiodes and interface circuitry are constructed.

Each of the bit lines terminates in a column processing circuit 44 that typically includes sense amplifiers and column decoders. The bit lines are a parallel array of conductors that run vertically in the metal layers over the substrate in which the photodiode and interface circuitry are constructed. Each sense amplifier reads the signal produced by the pixel sensor that is currently connected to the bit line processed by that sense amplifier. The sense amplifiers may generate a digital output signal by utilizing an analog-to-digital converter (ADC). At any given time, a single pixel sensor is read out from the imaging array. The specific column that is read out is determined by a column address that is utilized by a column decoder to connect the sense amplifier/ADC output from that column to circuitry that is external to the imaging array. The sequencing of the control signals and other functions are performed by a controller 30. To simplify the drawings, the connections between controller 30 and the various control lines have been omitted from the drawing.

Figure 2:
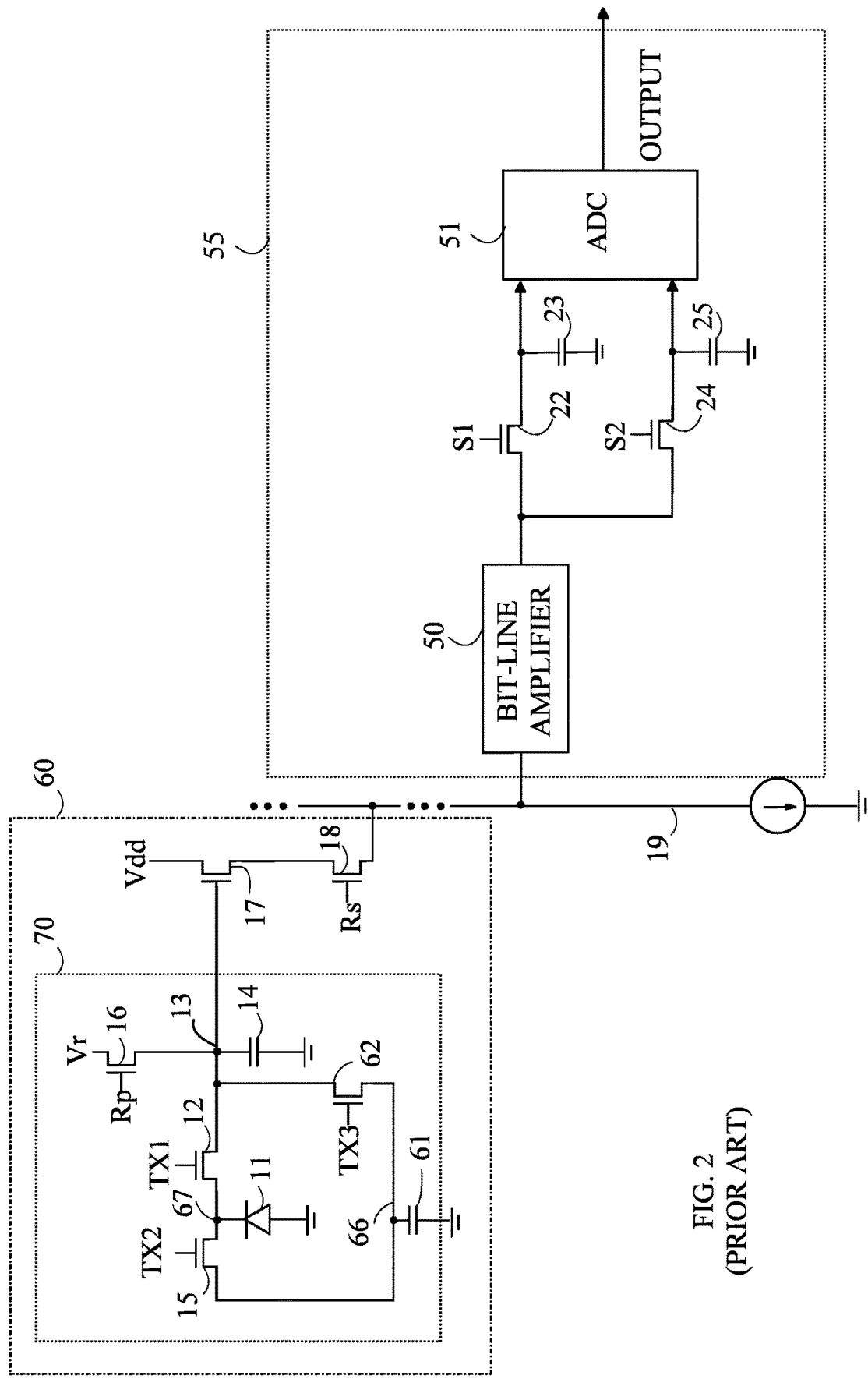
FIG. 2 illustrates a prior art pixel sensor that utilizes a single photodiode in each pixel sensor and an overflow capacitor to extend the range of the dynamic range of the pixel sensor.

Refer now to FIG. 2, which illustrates a prior art pixel sensor that utilizes a single photodiode in each pixel sensor and an overflow capacitor to extend the range of the dynamic range of the pixel sensor.

To simplify the following discussion, the portion of pixel sensors 60 shown at 70 will be referred to as a capacitive overflow pixel sensor. The capacitive overflow pixel sensor includes a photodiode 11 and that overflow capacitor 61 is characterized by first and second capacitor terminals. Photodiode 11 is connected to a floating diffusion node 13 by photodiode transfer gate 12. Photodiode 11 is also connected to the first capacitive terminal of overflow capacitor 61 by overflow gate 15. The first capacitive terminal of overflow capacitor 61 is also connected to floating diffusion node 13 by overflow capacitor gate 62. Floating diffusion node 13 is characterized by a parasitic capacitance shown at 14. The voltage on floating diffusion node 13 can be set to a voltage Vr by placing gate 16 in a conductive state.

Referring again to pixel sensors 60, floating diffusion node 13 is connected to source follower 17 which generates an output voltage indicative of the potential on floating diffusion node 13. The output of source follower 17 can be coupled to a bit line 19 by gate 18. The second capacitive terminal of overflow capacitor 61 is connected to ground in pixel sensors 60.

Bit line 19 terminates in a column processing circuit 55. Column processing circuit 55 includes a bit-line amplifier 50 and two sample and hold circuits whose functions will be described in more detail below. The first sample and hold circuit comprises gate 22 and capacitor 23, and the second sample and hold circuit comprises gate 24 and capacitor 25. The outputs of these sample and hold circuits are processed by ADC 51 to provide the output value for the pixel sensor currently connected to bit line 19. The manner in which the sample and hold circuits are used will be discussed in more detail below.

Overflow capacitor 61 collects the photocharge generated by photodiode 11 after the potential at node 67 reaches a potential during the exposure that is determined by the voltage on node 67 and the voltage of TX2. At the beginning of an exposure, photodiode 11 and overflow capacitor 61 are set to a reset voltage determined by Vr. As photocharge accumulates on photodiode 11, the voltage on photodiode 11 decreases. At a voltage determined by the gate voltage on overflow gate 15, the excess charge flows through overflow gate 15 and onto the combination of overflow capacitor 61, capacitor 14, and the parasitic capacitances of overflow capacitor gate 62, which remains in a conducting state throughout the exposure.

The charge that has accumulated either on node 67 or overflow capacitor 61 are read at the end of the exposure. In one embodiment, overflow capacitor 61 is read first. During the exposure, TX3 is high, and hence, overflow capacitor 61 is connected to floating diffusion node 13. The potential on floating diffusion node 13 is the difference between the reset potential that was applied to floating diffusion node 13 and overflow capacitor 61 just prior to the start of the next exposure. The potential on floating diffusion node 13 is stored on capacitor 23. Then, floating diffusion node 13 and node 66 are reset, and the reset potential is stored on capacitor 25. The difference in potentials on capacitors 23 and 25 is then digitized by ADC 51.

The potential on photodiode 11 is then read. First, overflow capacitor 61 is isolated by placing overflow capacitor gate 62 in the non-conducting state, and floating diffusion node 13 is again reset to Vr. The actual potential on floating diffusion node 13 is then stored on capacitor 23. Gate 12 is then placed in the conducting state, which transfers the charge on photodiode 11 to floating diffusion node 13. The potential on floating diffusion node 13 is stored on capacitor 25. The difference in potentials on capacitors 23 and 25 is then digitized by ADC 51.

The maximum photocharge that can be stored in overflow capacitor 61 is determined by the voltage on node 66 after pixel sensor 60 is reset prior to an exposure. Pixel sensor 60 is reset by placing gates 16, 12, and 62 in conducting states and then isolating photodiode 11 and overflow capacitor 61 by placing gates 16 and 12 in a non-conducting state. This leaves nodes 66, 67 and 13 at a potential of Vr. As the exposure proceeds, electrons generated in photodiode 11 decrease the potential on node 67. When the potential on node 67 drops to a value determined by the voltage on overflow gate 15, the photo-electrons overflow onto overflow capacitor 61. Each photo-electron that is stored on overflow capacitor 61 lowers the potential at node 66. When the potential on node 66 or 13 reaches the potential at which the bit line 19 is saturated during the readout phase, the maximum full-well capacity or maximum photocharge is reached. The bit line is saturated when its voltage doesn't follow the voltage on floating diffusion node 13 linearly.

The dynamic range of pixel sensor 60 is the ratio of the maximum photocharge that can be stored in the pixel sensor to the minimum photocharge that can be detected by the readout circuitry. The maximum photocharge is the sum of the charge stored on overflow capacitor 61 and the charge stored on photodiode 11 at readout. Hence, to increase the dynamic range in the pixel shown in FIG. 2, the capacitance of overflow capacitor 61 would need to be increased. However, as noted above, there are limits to the size of the overflow capacitor, since there must be one such capacitor per pixel sensor. Typically, the overflow capacitor is constructed in the metal layers over the substrate in which the photodiode is constructed.

Figure 3:
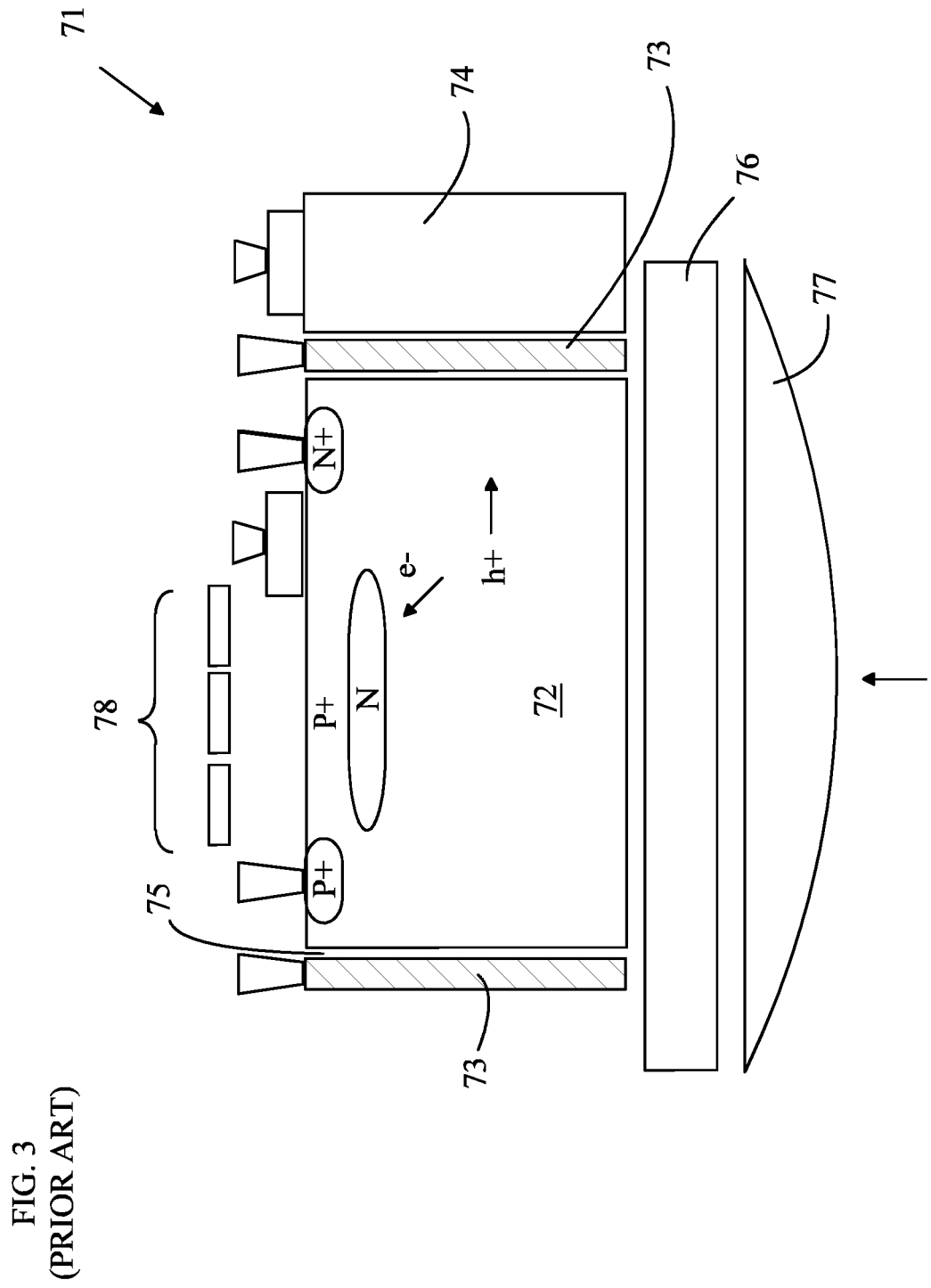
FIG. 3 is a cross-sectional view of a conventional pixel sensor.
Figure 4:
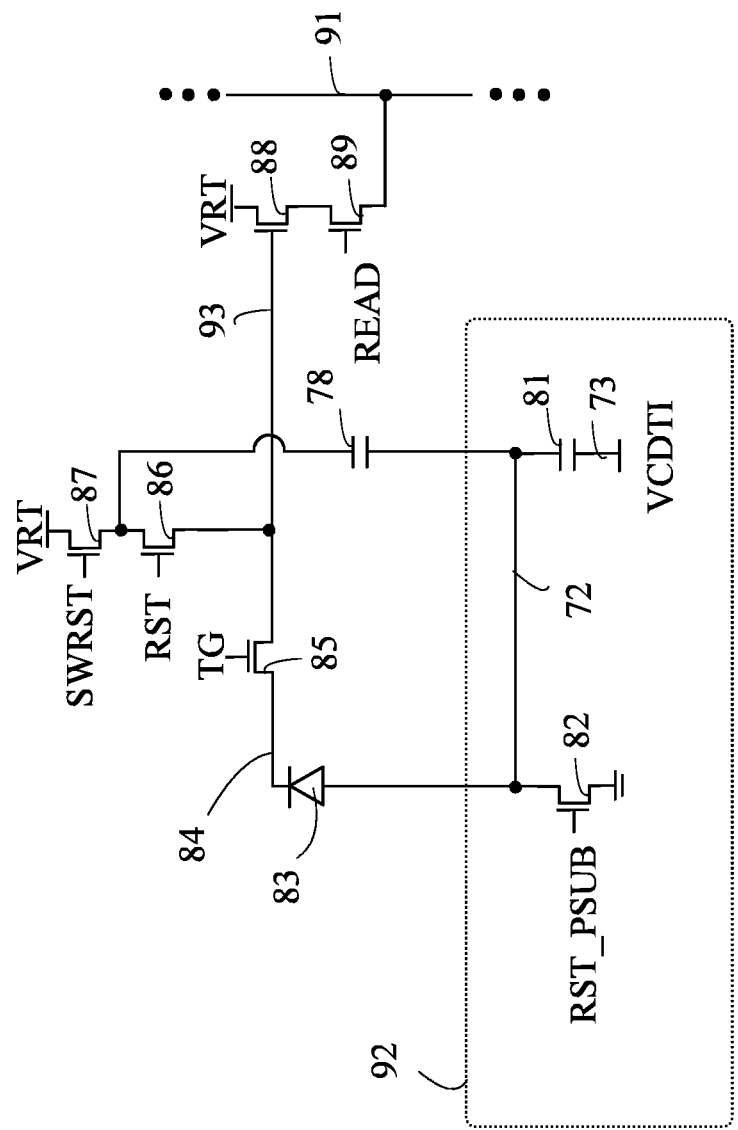
FIG. 4 is an equivalent circuit for the conventional pixel sensor.

Refer now to FIGS. 3 and 4, which illustrate another prior art overflow capacitor pixel design that provides increased storage capacitance. FIG. 3 is a cross-sectional view of pixel sensor 71, and FIG. 4 is an equivalent circuit for pixel sensor 71. Pixel sensor 71 is a backside sensor. That is, the light enters pixel sensor 71 from the surface of the wafer opposite to that in which the gates and photodiode are constructed. The incident light is imaged onto the pixel sensor by a micro-lens 77 and filtered by a color filter 76 to provide a signal in a desired color band. The voltage on floating diffusion node 93 is read by source follower 88 that connects the voltage to a bit line 91 in response to a row read signal on gate 89.

Pixel sensor 71 also differs from the other prior art pixel sensors discussed above in that the p-substrate in which the photodiode is constructed is isolated from the neighboring photosensors by a deep trench. This trench passes completely through the substrate and is lined with an insulating oxide 75. The body of the trench is filled with a conductor 73 such as polysilicon. The polysilicon forms one plate of a capacitor 81. The p-substrate forms the other plate of capacitor 81. Capacitor 81 has significantly more capacitance than the capacitors used in prior art capacitive overflow sensors, and hence, this design has the potential for increasing the dynamic range of the pixel sensor.

Pixel sensor 71 also differs from the above-discussed overflow pixel sensors in that the holes generated by the conversion of photons to electrons are stored instead of the overflow electrons. The holes are readout with the help of capacitor 78. The readout circuitry for both the holes and electrons is constructed in region 74.

Once photodiode 83 reaches saturation, the holes generated by the conversion of photons to hole-electron pairs are stored on capacitor 81 which is part of a hole storage sub-unit 92. Initially, node 72 is reset to ground via gate 82. Node 72 is then isolated and floats. Node 84 is initially reset to VRT. As photoelectrons are accumulated at node 84, the potential at node 84 decreases. When node 84 reaches a sufficiently low potential, the excess electrons are bled off through gate 85. The holes corresponding to these excess electrons accumulate on capacitor 81. At the end of the integration period, the electrons stored at node 84 and the holes stored on capacitor 81 are readout with the aid of gates 86 and 87. For small light signals, the electrons provide the exposure measurement. At larger light signals, the hole signal is used to provide the exposure measurement.

The voltage at node 72 increases as holes move to capacitor 81. When the voltage reaches a threshold determined by the voltage at node 84, the hole current will flow out through photodiode 83. At this point, the pixel sensor is saturated and cannot measure light exposures at light levels beyond those that cause this threshold to be exceeded. To provide a higher dynamic range in this device, the capacitance of capacitor 81 would need to be increased.

The cost of an imaging array is directly related to the size of the pixel sensors. Hence, to reduce the cost of the imaging array, the size of the pixel sensors must be reduced. Unfortunately, such a size reduction results in a decrease in the capacitance of capacitor 81. The capacitance of capacitor 81 is proportional to the surface area of the trench through substrate 72.

A pixel sensor according to the present disclosure obtains an improvement in dynamic range by using the overflow electrons to offset a portion of the substrate voltage rise associated with the accumulation of the holes. In addition, a pixel sensor according to the present disclosure does not require the measurement of a positive charge to arrive at the overflow charge.

Figure 5:
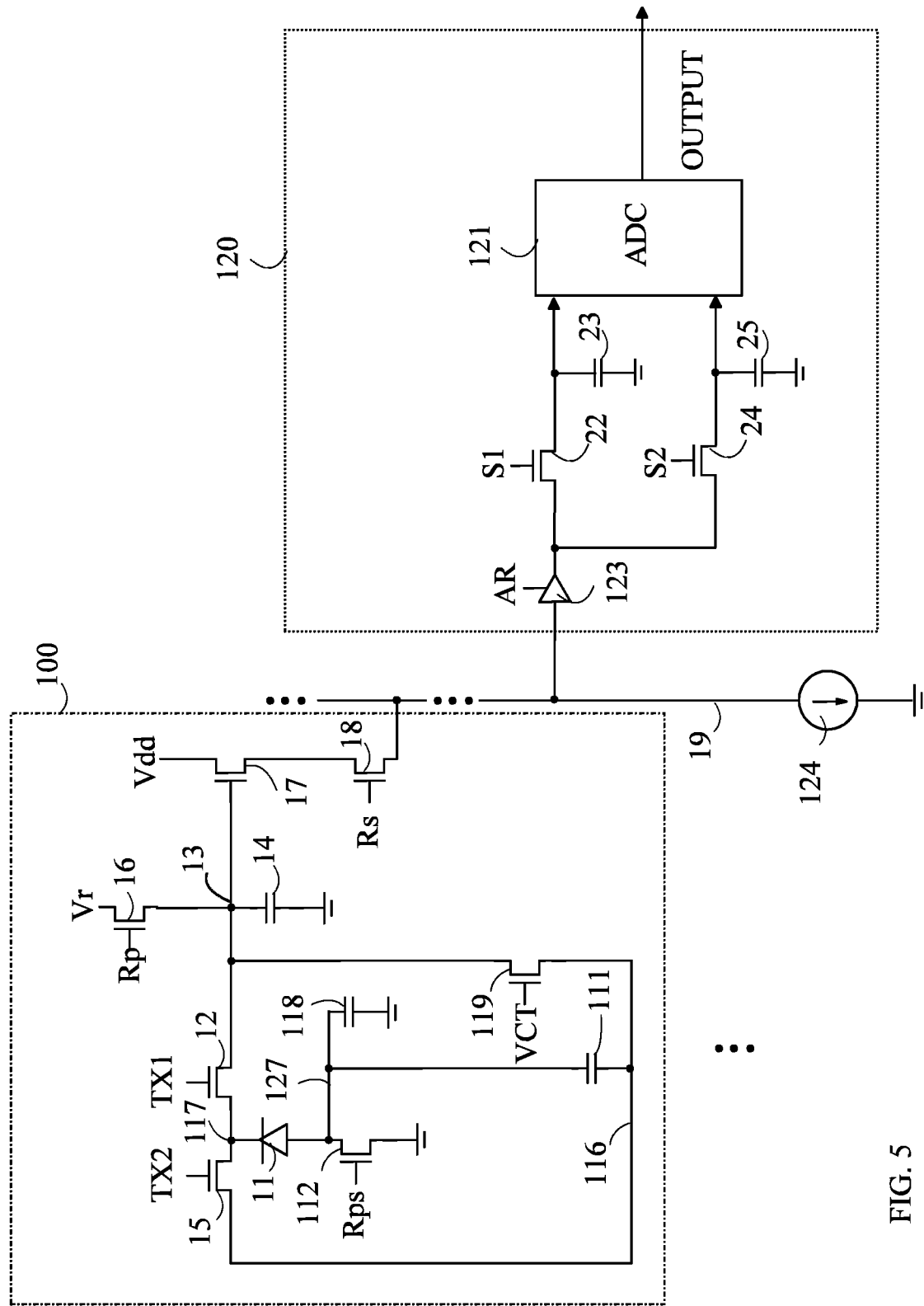
FIG. 5 illustrates one embodiment of a pixel sensor according to the present disclosure.

Refer now to FIG. 5, which illustrates one embodiment of a pixel sensor 100 according to the present disclosure. In this example, the pixel sensors are organized into a rectangular array of rows and columns of pixel sensors in which each pixel sensor in a given column is connected to a common bit line, such as bit line 19. The particular pixel sensor that is connected to bit line 19 is determined by a gate 18 within the pixel sensor. To simplify the drawing, only one pixel sensor in one column is shown. The signal on bit line 19 is processed by a column processing circuit 120 during the readout of the exposure measured by pixel sensor 100.

Pixel sensor 100 includes an N-type photodiode 11 used to collect electrons and an electrically-isolated substrate with capacitor C118 to collect holes. The electrically isolated substrate is created in a manner analogous to that discussed above by etching an insulating trench around the substrate. The trench is filled with polysilicon that forms one plate of capacitor 118. A gate 112 controlled by signal Rps is used to reset the Hnode 127 to ground. A transfer gate 12 that is controlled by TX1 connects photodiode 11 to floating diffusion node 13. When floating diffusion node 13 is at a sufficiently high potential, any electrons on Enode 117 are transferred off of photodiode 11 and can be measured by noting the change in voltage on floating diffusion node 13 via source follower 17, when source follower 17 is connected to bit line 19 by gate 18.

Overflow gate 15 enables the overflow electrons to be transferred off of photodiode 11 to capacitor 111 which is used to collect overflow electrons from the photodiode 11. Gate 119, which is controlled by signal VCT, connects or disconnects node 116 to floating diffusion node 13. Gate 16, which is controlled by signal Rp, is used to reset floating diffusion 13 to voltage Vr.

In this exemplary embodiment, the voltages on bit line 19 are processed by column readout circuit 120 which includes a column bit line amplifier 123, two sampling capacitors 23 and 25, which are used as analog memories for correlated double sampling (CDS). For the purposes of this disclosure, CDS includes any application in which a charge that is to be readout is determined by taking the difference of two voltages on bit line 19. The voltages on capacitors 23 and 25 are controlled by gates 22 and 24, respectively, in response to control signals S1 and S2, respectively. ADC 121 digitizes the difference in the voltages stored on capacitors 23 and 25. Current source 124 is used to bias bit line 19 during the readout process.

Figure 6:
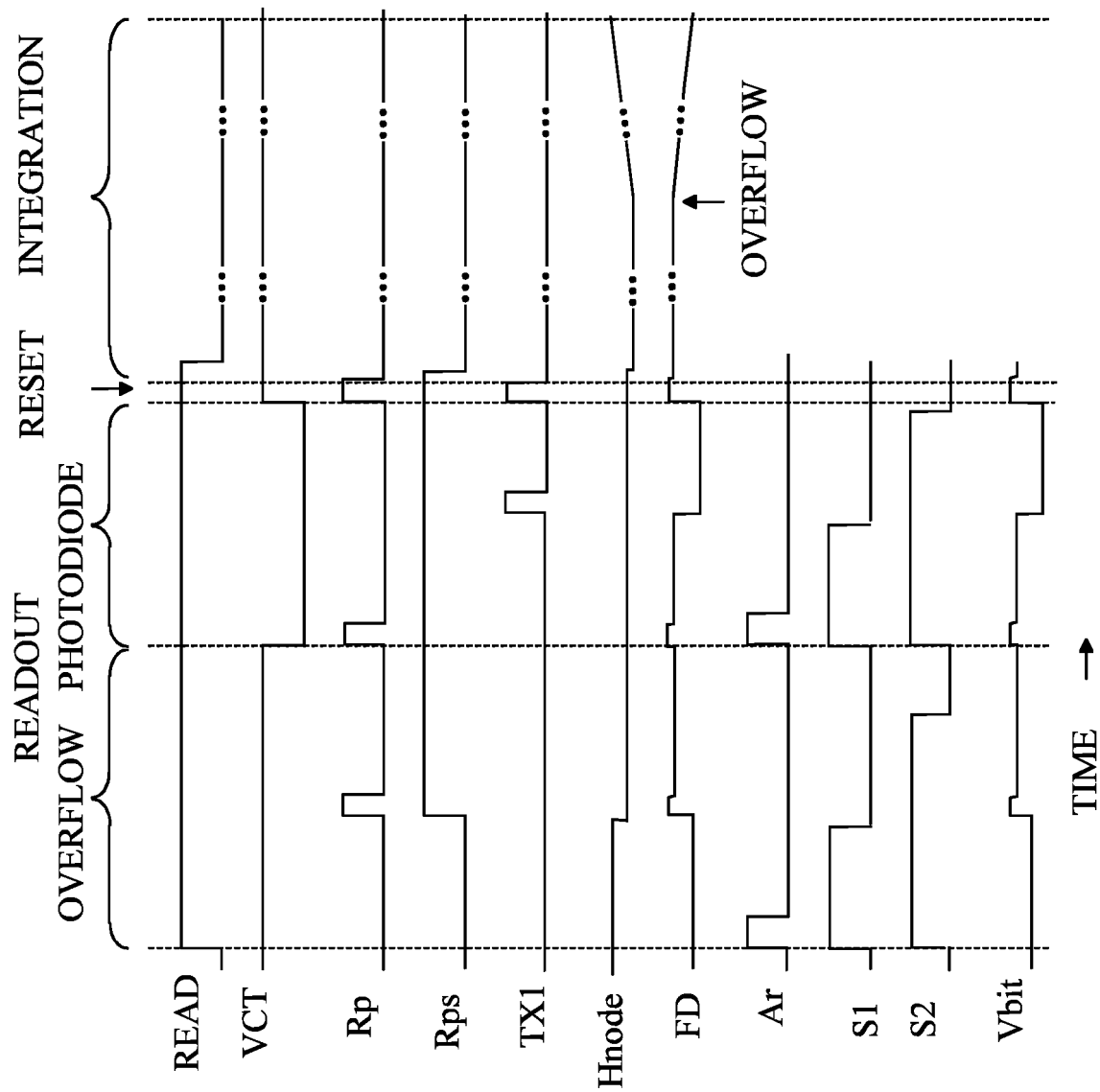
FIG. 6 illustrates the timing of the various operations that take place when a pixel sensor is used to measure a light exposure.

Refer now to FIG. 6, which illustrates the timing of the various operations that take place when a pixel sensor, such as pixel sensor 100, is used to measure a light exposure. The operation of pixel sensor 100 can be divided into three phases. In the first phase, pixel sensor 100 is reset and charge is integrated for an exposure period. In the second phase, the charge that overflowed photodiode 11 is read out, and in the third stage, the charge that is stored on the photodiode itself is read out. To simplify the following discussion, gates 16, 12, 119, and 112 will be assumed to be ideal switches. That is, when these gates are in the conducting state there is no substantial potential drop across the gate. In practice, if there is a small voltage drop, the reset potential, Vr, can be increased slightly to account for this drop.

Pixel sensor 100 is reset by placing gates 12, 16, 119, and 112 in the conducting state. At the end of the reset, node 117 is at a potential of substantially Vr, floating diffusion node 13 and node 116 are also at Vr. Hnode 127 is reset to ground. During the integration period, gate 119 remains in the conducting state, and gates 12, and 112 are set to the non-conducting state. Hence, node 116 tracks the voltage the floating diffusion node 13 during integration. Signal TX2 is set such that photoelectrons will leak off of node 117 through overflow gate 15 when the potential at node 117 decreases below a predetermined threshold value.

The manner in which pixel sensor 100 provides its advantages can be more easily understood by considering the case of an exposure in which the maximum light level measured is greater than that which can be accommodated by photodiode 11. Early in the exposure, the potential at Enode 117 is greater than the threshold at which electrons leak off of Enode 117. The photoelectrons generated during this part of the exposure accumulate at Enode 117, and the holes corresponding to these photoelectrons are stored in the pinned junction to balance their electron counterparts. As the voltage at Enode 117 decreases below the threshold value discussed above, electrons leak off of Enode 117, and the voltage at node 116 begins to decrease from its reset value of Vr. Since gate 119 is in the conducting state, the voltage on floating diffusion node 13 also decreases. At the same time, the holes corresponding to the leaking photoelectrons migrate to Hnode 127 and are stored on capacitor 118. Hence, the voltage at Hnode 127 will increase, since the substrate is isolated from ground by gate 112. However, the change in voltage across capacitor 111 results in electrons moving from capacitor 111 to Hnode 127, which cancels part of this increase. Accordingly, the number of holes that can accumulate at Hnode 127 is increased relative to the prior art scheme discussed above.

Prior to the start of the next accumulation phase, the charge that was accumulated during the last integration phase is read out. This overflow charge can be viewed as consisting of two allocates of charge. The first is the overflow charge that is stored on capacitor 14 associated with floating diffusion node 13. This is the charge that leaked off of the photodiode and reduced the potential on floating diffusion node 13 during the charge integration period. This charge can be measured by observing the voltage drop on floating diffusion node 13 from the reset voltage.

The second allocate of overflow charge is the charge stored on capacitor 111 to balance the positive potential on Hnode 127 resulting from the migration of the holes to capacitor 118. This charge can be measured by resetting floating diffusion node to Vr and then measuring the drop in voltage at floating diffusion node 13 when Hnode 127 is reset to ground using gate 112. It should be noted that the total overflow charge cannot be measured by grounding Hnode 127 before measuring the voltage on floating diffusion node 13. At higher exposures, the sum of these two charges can exceed the total charge that can be measured by resetting floating diffusion node 13 to Vr and then transferring the electrons to floating diffusion node 13.

Refer to FIG. 5 and FIG. 6, during the overflow charge readout, the bit line 19 is connected to the positive terminal of the column bit line amplifier 123. During the photodiode charge readout, the bit line 19 is connected to the negative terminal of the column bit line amplifier 123. This ensures that the voltage on capacitor 25 is not less than the voltage on capacitor 23. To simplify the drawing, the terminal-switching circuit is omitted from the figure. This arrangement allows ADC 121 to digitize the difference between the two voltages in each of the readouts discussed below.

With the timing describing in FIG. 6, the readout scheme always uses correlated double sampling (CDS) for both overflow charge and photodiode charge readouts to reduce the dominant flicker noise of the source follower 17. However, for the overflow charge readout, the CDS can't remove the reset noise. However, the reset noise is much smaller than the shot noise in the case of the overflow charge, which corresponds to high light exposures, and hence, the correction for reset noise does not significantly improve the measurement for overflow charge. For the photodiode charge readout, the CDS removes the reset noise.

Hence, in this embodiment, CDS is used for both overflow charge and photodiode charge readouts. Also, the ADC 121 always digitizes the difference between the two stored voltages on capacitors 23 and 25 at the same time for both overflow charge and photodiode charge readouts.

It should be noted that the pixel sensor of the present disclosure has a substantially larger full well capacity than the prior art pixel sensor shown in FIG. 4 for the same size hole storage capacitor. The maximum hole storage charge that can be accommodated by hole storage capacitor 81 is the capacitance of capacitor 81 times the maximum voltage rise at node 72. Node 72 starts at ground and can rise to a maximum of the reset voltage. Next, consider capacitor 118 shown in FIG. 5. Initially, node 127 is at ground and node 116 is at Vr. Hence, there is an excess of electrons stored on capacitor 111 by the voltage difference across that capacitor. As holes accumulate at node 127, the corresponding electrons flow to node 116 resulting in the potential at node 116 decreasing. This decrease in potential releases electrons held on capacitor 111 to cancel part of the charge on node 127. Hence, more holes can accumulate at node 127 before the voltage at node 127 reaches its maximum in a pixel sensor according to the present disclosure.

The above-described embodiments have been provided to illustrate various aspects of an improved pixel sensor. However, it is to be understood that different aspects provided in this disclosure that are shown in different specific embodiments can be combined to provide other embodiments. In addition, various modifications to the pixel sensor described here will become apparent from the foregoing description and accompanying drawings. Accordingly, the pixel sensor described here is to be limited solely by the scope of the following claims.

What is claimed is:

1. An apparatus comprising a plurality of pixel sensors connected to a bit line, at least one of said pixel sensors comprising:
    a photodiode having a cathode connected to an electron storage node and an anode connected to a hole storage node;
    an overflow path connected to said electron storage node by an overflow gate that allows electrons to leak off of said electron storage node into said overflow path if said electron storage node has a potential less than a leakage potential;
    a floating diffusion node connected to said electron storage node by a transfer gate;
    an overflow path gate connecting said overflow path to said floating diffusion node;
    a hole storage node reset gate that connects said hole storage node to ground;
    a hole storage capacitor having a terminal connected to said hole storage node and another terminal connected to ground; and
    an overflow path coupling capacitor connecting said hole storage node to said overflow path.

2. The apparatus of claim 1 wherein said one of said pixel sensors comprises:
    a reset gate that connects said floating diffusion node to a reset bus;
    a buffer amplifier that generates an output potential indicative of a potential on said floating diffusion node; and
    a selection gate that couples said output potential to said bit line in response to a row selection signal.

3. The apparatus of claim 1 wherein said photodiode is fabricated in a substrate and wherein said hole storage capacitor comprises a trench surrounding said photodiode in said substrate, said trench being lined with an insulator and filled with a conductor, said conductor being connected to ground, said trench isolating said photodiode from others of said plurality of pixel sensors.

4. The apparatus of claim 1 further comprising a controller that initializes said one of said pixel sensors by connecting said electron storage node, said overflow path, and said floating diffusion node to a reset bus at a reset potential and said hole storage node to ground, and then isolates said electron storage node and said floating diffusion node from said reset bus while leaving said overflow path connected to said floating diffusion node.

5. The apparatus of claim 4 wherein said controller measures an overflow charge that leaked off of said electron storage node during a prior exposure of said photodiode.

6. The apparatus of claim 5 wherein said controller measures said overflow charge after an exposure in two steps, a first step comprising measuring a voltage on said floating diffusion node after said exposure.

7. The apparatus of claim 6 wherein a second step comprises resetting said floating diffusion node to said reset potential, measuring said reset potential, resetting said hole storage node to ground, and then measuring said potential of said floating diffusion node.

8. The apparatus of claim 5 wherein said controller measures a photodiode charge stored on said photodiode from a previous exposure after measuring said overflow charge.

9. The apparatus of claim 8 wherein said photodiode charge is measured using correlated double sampling.

10. A pixel sensor comprising:
- a photodiode having a cathode connected to an electron storage node and an anode connected to a hole storage node;
- an overflow path connected to said electron storage node by an overflow gate that allows electrons to leak off of said electron storage node into said overflow path if said electron storage node has a potential less than a leakage potential;
- a floating diffusion node connected to said electron storage node by a transfer gate;
- an overflow path gate connecting said overflow path to said floating diffusion node;
- a hole storage node reset gate that connects said hole storage node to ground;
- a hole storage capacitor having a terminal connected to said hole storage node and another terminal connected to ground; and
- an overflow path coupling capacitor connecting said hole storage node to said overflow path.

11. The pixel sensor of claim 10 further comprising:
- a reset gate that connects said floating diffusion node to a reset bus;
- a buffer amplifier that generates an output potential indicative of a potential on said floating diffusion node; and
- a selection gate that couples said output potential to a bit line in response to a row selection signal.

12. The pixel sensor of claim 10 wherein said photodiode is fabricated in a substrate and wherein said hole storage capacitor comprises a trench surrounding said photodiode in said substrate, said trench being lined with an insulator and filled with a conductor, said conductor being connected to ground, said trench isolating said photodiode from other circuits constructed in said substrate.

\* \* \* \* \*